United States Patent
Lee et al.

(10) Patent No.: US 7,745,811 B2
(45) Date of Patent: Jun. 29, 2010

(54) PHASE CHANGE MEMORY DEVICES AND METHODS FOR FABRICATING THE SAME

(75) Inventors: Hengyuan Lee, Tainan County (TW); Der-Sheng Chao, Taichung County (TW)

(73) Assignee: Industrial Technology Research Institute, Hsinchu (TW)

( * ) Notice: Subject to any disclaimer, the term of this patent is extended or adjusted under 35 U.S.C. 154(b) by 132 days.

(21) Appl. No.: 11/561,365

(22) Filed: Nov. 17, 2006

(65) Prior Publication Data

US 2008/0042243 A1   Feb. 21, 2008

(30) Foreign Application Priority Data

Aug. 16, 2006   (TW) .............................. 95130066 A (51) Int. Cl.
*H01L 47/00* (2006.01)
*H01L 29/02* (2006.01)

(52) U.S. Cl. ........................ 257/4; 257/2; 257/E47.001; 257/E29.002

(58) Field of Classification Search ................. 257/2–5, 257/E29.002, E47.001
See application file for complete search history.

(56) References Cited

U.S. PATENT DOCUMENTS

| | | | |
|---|---|---|---|
| 6,838,692 B1 * | 1/2005 | Lung | 257/4 |
| 2005/0029503 A1 | 2/2005 | Johnson | |
| 2005/0110983 A1 * | 5/2005 | Jeong et al. | 356/148 |
| 2005/0245030 A1 | 11/2005 | Ha et al. | |
| 2006/0099795 A1 * | 5/2006 | Lee et al. | 438/618 |
| 2006/0108667 A1 * | 5/2006 | Lung | 257/624 |
| 2007/0278529 A1 * | 12/2007 | Lai et al. | 257/209 |
| 2007/0290185 A1 * | 12/2007 | Wang | 257/3 |

* cited by examiner

*Primary Examiner*—Anh Phung
*Assistant Examiner*—Allison P Bernstein
(74) *Attorney, Agent, or Firm*—Quintero Law Office (57) ABSTRACT

Phase change memory devices and methods for fabricating the same. An exemplary phase change memory device includes a conductive element formed in a dielectric layer. A phase change material layer is formed in the dielectric layer. A conductive layer extends in the dielectric layer to respectively electrically connect the phase change layer and a sidewall of the conductive element.

15 Claims, 13 Drawing Sheets

PHASE CHANGE MEMORY DEVICES AND METHODS FOR FABRICATING THE SAME

BACKGROUND OF THE INVENTION

1. Field of the Invention

The invention relates to a memory device and more particularly to a phase change memory (PCM) device and a method for fabricating the same.

2. Description of the Related Art

Phase change memory devices are non-volatile, highly readable, highly programmable, and require a lower driving voltage/current. Current phase change memory device topics of interest include increasing cell density and reducing current density.

Phase change material in a phase change memory device has at least two solid phases, a crystalline state and an amorphous state. Transformation between these two phases can be achieved by changing the temperature of the phase change material. The phase change material exhibits different electrical characteristics depending on state. For example, in an amorphous state, the material exhibits a higher resistivity than in a crystalline state. Such phase change material may switch between numerous electrically detectable conditions of varying resistivity on a nanosecond time scale with the input of pico joules of energy. Chalcogenide material is a popular and widely used phase change material in modern phase change memory technology.

Since phase transformation of the phase change material is reversible, a bit status of a memory device can be distinguished by differences in resistivity of the phase change material in a PCM device in a crystalline state and an amorphous state.

Figure 1:
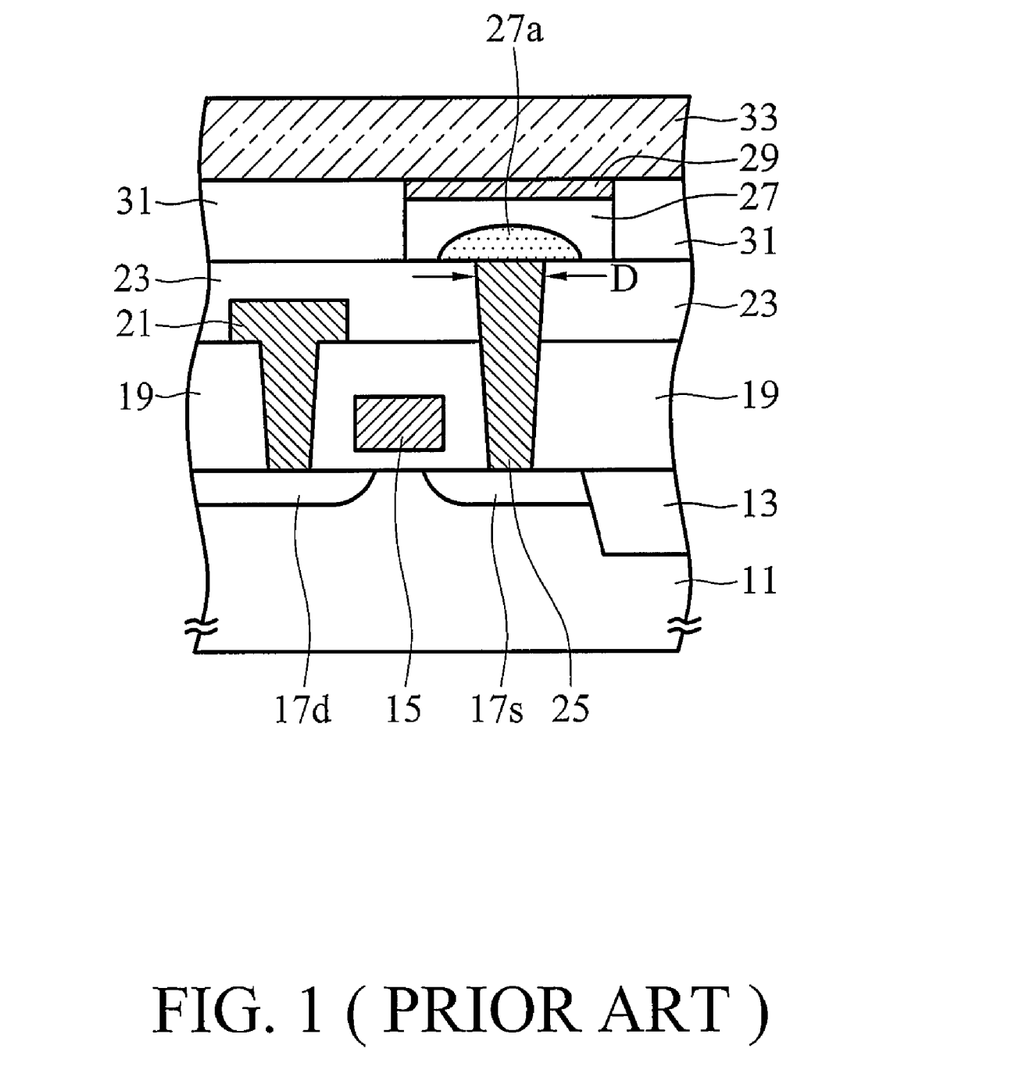
FIG. 1 is cross section showing a conventional phase change memory cell.

FIG. 1 is a cross section view of a conventional phase change memory (PCM) cell. As shown in FIG. 1, an isolation structure 13 is located at a predetermined region of a semiconductor substrate 11 to thereby define an active region. A source region 17s and a drain region 17d are disposed apart in the active region. A gate 15, functioning as a word line, is disposed across the active region between the source region 17s and the drain region 17d. The gate 15, the source region 17s and the drain region 17d form an transistor. The semiconductor substrate 11 having the transistor thereon is covered with an insulating layer 19. An interconnection line 21 is disposed over the first insulating layer 19. The interconnection line 21 is electrically connected to the drain region 17d through a contact hole penetrating the first insulating layer 19. Another insulating layer 23 covers the interconnection line 21. A heating plug 25 is disposed in the insulating layers 19 and 23, electrically connecting the source region 17s. A patterned phase change material layer 27 and a top electrode 29 are sequentially stacked over the insulating layer 23, wherein a bottom surface of the phase change material layer pattern 27 is in contact with the heating plug 25. Another insulating layer 31 is disposed on the insulating layer 23. A bit line 33 is located on the insulating layer 31 and is in contact with the top electrode 29.

In a write mode, the transistor is turned on and a large current flows through the heating plug 25, thus heating up an interface between the phase change material layer pattern 27 and the heating plug 25, thereby transforming a portion 27a of the phase change material layer 27 into either the amorphous state or the crystalline state depending on the length of time and amount of current that flows through the heating plug 25.

One problem found with conventional phase change transistor as shown in FIG. 1 is the relatively large amount of current required to successfully change the state of the phase change material during a write operation. One solution to increasing current density is to reduce a diameter D of the heating plug 25. There is still a limitation in the amount of reduction possible to the diameter D of the heating plug 25 because a photolithographic process determines the minimum diameter D. It is difficult to consistently produce a smaller diameter heating plug 25 due to limitations in the present photolithographic process.

BRIEF SUMMARY OF THE INVENTION

Thus, an improved phase change memory device and a method for fabricating the same are desirable.

Phase change memory devices are provided. An exemplary embodiment of a phase change memory device comprises a conductive element formed in a dielectric layer. A phase change material layer is formed in the dielectric layer. A conductive layer extends in the dielectric layer to respectively electrically connect the phase change layer and a sidewall of the conductive element.

Another exemplary embodiment of a phase change memory device comprises a semiconductor substrate with a transistor formed thereover. A first dielectric layer is formed over the semiconductor substrate, covering the transistor. A first conductive plug is formed in the first dielectric layer, electrically contacting a source of the transistor. A second dielectric layer is formed over the first dielectric layer. A second conductive plug is formed in the second dielectric layer, electrically contacting the first conductive plug. A conductive layer extends in the second dielectric layer, electrically contacting a sidewall of the second conductive plug. A third dielectric layer is formed over the second dielectric layer. A phase change material layer is formed in the second and third dielectric layers, electrically contacting the conductive layer. An electrode is formed over the third dielectric layer, electrically connect the phase change material layer.

Still another exemplary embodiment of a phase change memory device comprises a pair of transistors formed over and located respectively on a portion of a semiconductor substrate. A first dielectric layer is formed over the semiconductor substrate, covering the transistors. A pair of first conductive plugs is respectively formed in a portion of the first dielectric layer, electrically contacting a source of one of the transistors. A second dielectric layer is formed over the first dielectric layer. A pair of second conductive plugs is formed in a portion of the second dielectric layer, respectively, electrically contacting the first conductive plug. A pair of conductive layers extends in a portion of the second dielectric layer, respectively, electrically contacting a sidewall of the second conductive plug. A third dielectric layer is formed over the second dielectric layer. A phase change material layer is formed in the third and second dielectric layers, electrically contacting the conductive layers. An electrode is formed over the third dielectric layer, electrically connecting the phase change material layer An exemplary method for fabricating a phase change memory device comprises forming a transistor over a semiconductor substrate. A first dielectric layer is formed over the semiconductor substrate, covering the transistor. A first conductive plug is formed in the first dielectric layer, electrically contacting a source of the transistor. A second dielectric layer is formed over the first dielectric layer. A second conductive plug is formed in the second dielectric layer, electrically contacting the first conductive plug. A conductive layer extends in the second dielectric layer, electrically contacting a sidewall of the second conductive plug. A third dielectric layer is formed over the second dielectric layer. A phase change material layer is formed in the third and second dielectric layers, electrically contacting the conductive layer. A conductive line is formed over the third dielectric layer, electrically connecting the phase change material layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 2-16 are schematic diagrams during different fabrication steps of a phase change memory device according to an embodiment of the invention, wherein FIGS. 2, 4, 6, 8, 11, and 14 are schematic top views and FIGS. 3, 5, 7, 9, 10, 12, 13, 15, and 16 are schematic cross sections;

FIGS. 18-23 are schematic diagrams during different fabrication steps of a phase change memory device according to another embodiment of the invention, wherein FIGS. 18 and 21 are schematic top views and FIGS. 19-20 and 22-23 are schematic cross sections.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
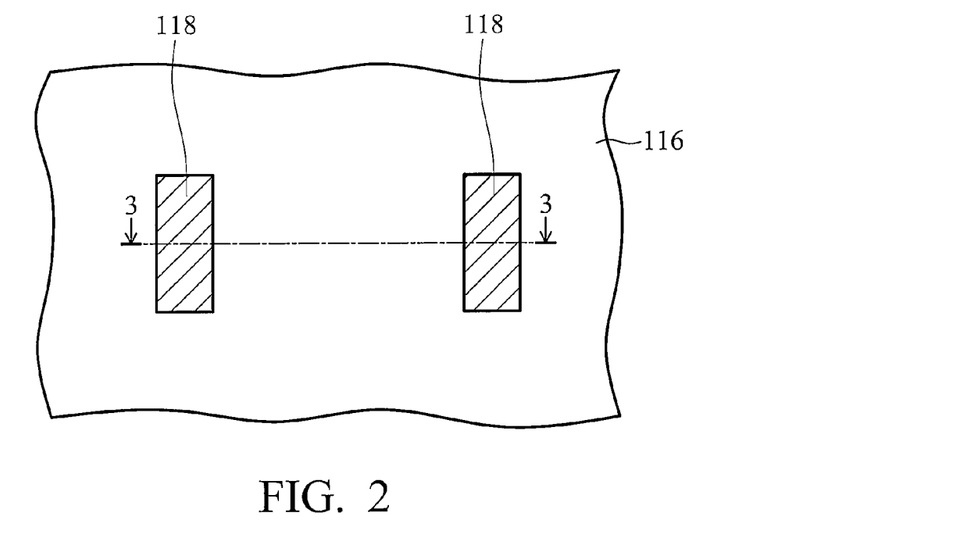
Figure 3:
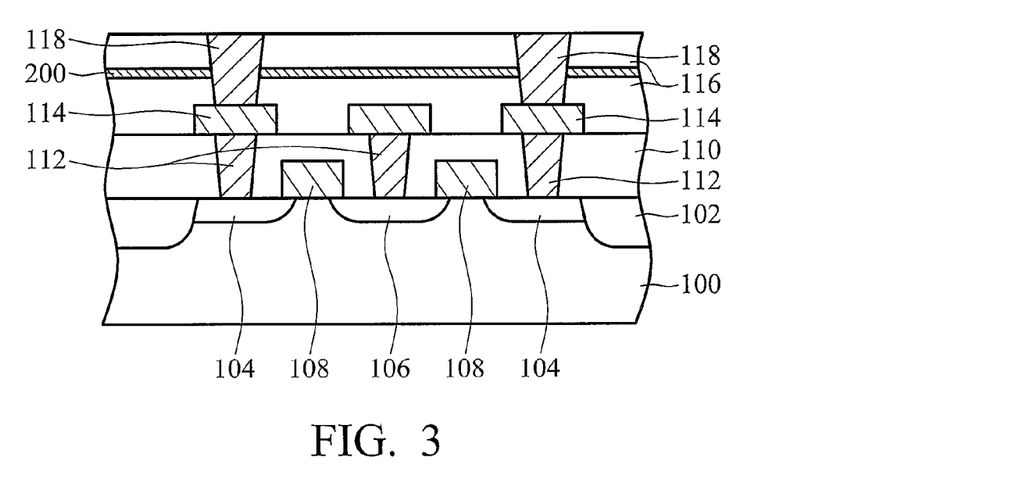

FIGS. 2-17 illustrate an exemplary method for fabricating a phase change memory device, wherein FIGS. 2, 4, 6, 8, 11 and 14 are schematic top views and FIGS. 3, 5, 7, 9, 10, 12, 13, 15 and 16 are schematic cross sections, both showing different fabrication steps therein Referring now to FIGS. 2 and 3, a semiconductor device, for example a semiconductor device illustrated in FIG. 3, is provided. The semiconductor device is provided with a plurality of active devices and interconnects formed thereon. The active devices are illustrated as transistors here but are not limited thereto, and may electrically connect a memory cell by the interconnect structures at proper locations, respectively, thereby controlling a memory status thereof. As shown in FIG. 3, a plurality of isolation structures 102 is formed in semiconductor substrate 100. The isolation structures 102 are illustrated as short trench isolation (STI) structures here but are not limited thereto, and can be formed by other isolation structures such as filed oxide isolation structures. The transistors here are formed with a gate structure 108, a source region 104 and a drain region 106 formed in the active area of the semiconductor substrate 100. As shown in FIG. 3, the drain region 106 is illustrated as a drain region shared by a pair of transistors to thereby reduce a substrate area occupied by the active devices. Each of the gate structures include a gate dielectric layer and a gate sequentially stacked over the semiconductor substrate 100 and are merely illustrated here as a gate structure 108, for simplicity.

Still referring to FIGS. 2 and 3, a dielectric layer 110 is formed over the semiconductor substrate 100 and the gate structures 108. A plurality of conductive plugs 112 are then formed in the dielectric layer 110 at appropriate positions, respectively overlying the source regions 104 and the drain region 106. A plurality of inter-metal dielectric (IMD) layers 116 is formed over the dielectric layer 110 with an etching stop layer 200 formed therebetween for providing proper etching stop performance. In the underlying IMD layer 116, a plurality of conductive elements, for example conductive lines 114 and conductive plugs 118, are formed therein, wherein each of the conductive lines 114 are formed over one of the conductive plugs 112, electrically connecting thereto. The conductive plugs 118 formed through IMD layers 116 and the etching stop layer 200 to thereby respectively connect one of the conductive lines 114, thereby forming an interconnect structure. As shown in FIG. 2, a top view is illustrated with a top surface covered by the MD layer 116 exposed with two contact plugs 118 therein.

Figure 4:
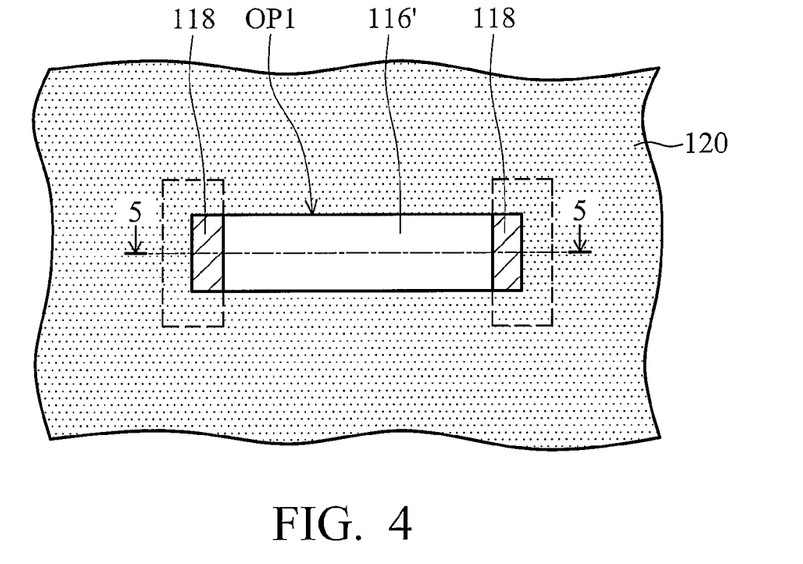
Figure 5:
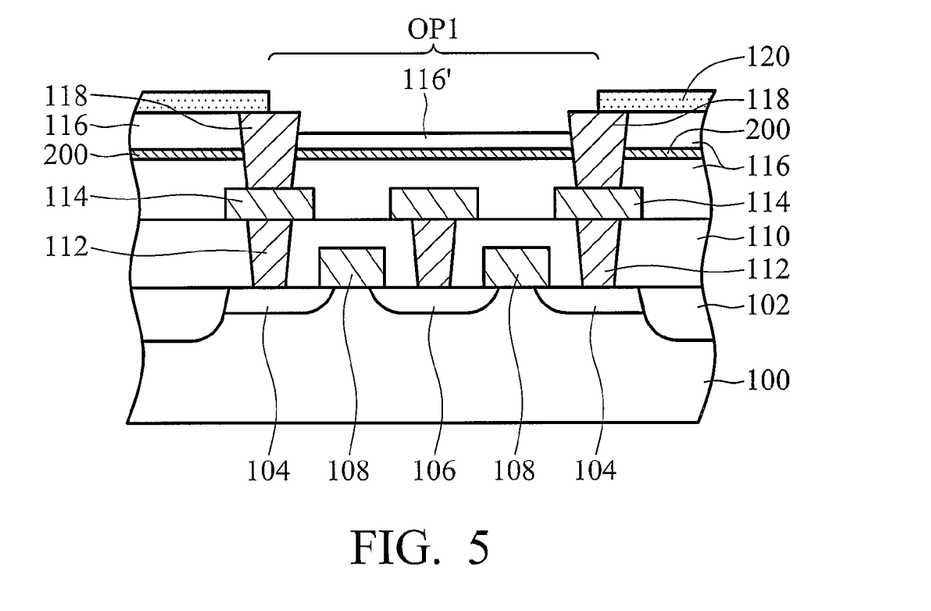

Referring to FIGS. 4 and 5, a mask layer 120 is next formed over the structure illustrated in FIGS. 2 and 3. The mask layer 120 can be, for example, a silicon nitride layer. The mask layer 120 is then patterned by, for example, conventional photolithography and etching processes thereby forming an opening OP1 exposing portions of the conductive plug 118 and the IMD layer 116. Next, the exposed portion of the IMD layer 116 is partially etched, using the patterned mask layer 120 as an etching mask, to form a recess in the opening OP1 and leave a thinned IMD layer 116'.

Figure 6:
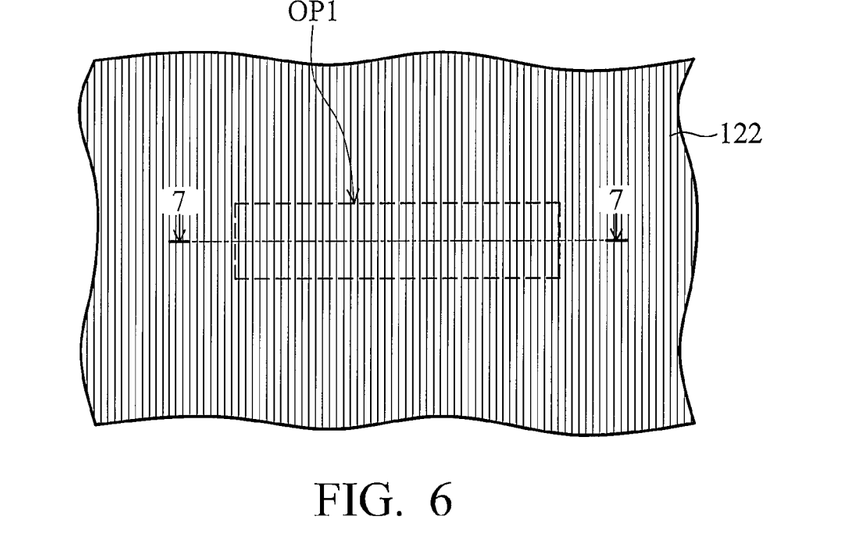
Figure 7:
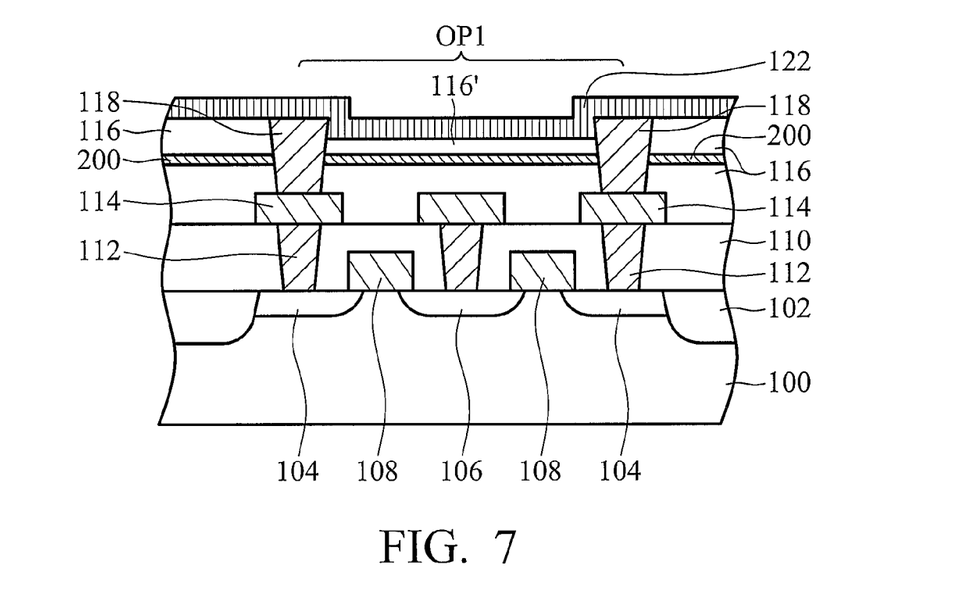

Referring now to FIGS. 6 and 7, after removal of the patterned mask layer 120, a conductive layer 122 is formed over the structures illustrated in FIGS. 4 and 5. The conductive layer 122 is formed over the IMD layer 116 and conductive plug 118, and conformably covers the thinned IMD layer 116 and sidewalls of the conductive plugs 118 exposed by the opening OP1. Herein, the conductive layer 122 may comprise TiN, TiW, TaN or TiAlW and may be formed by methods such as CVD, sputtering or ALD. The formed conductive layer 122 has a thickness of about 5-500=m.

Figure 8:
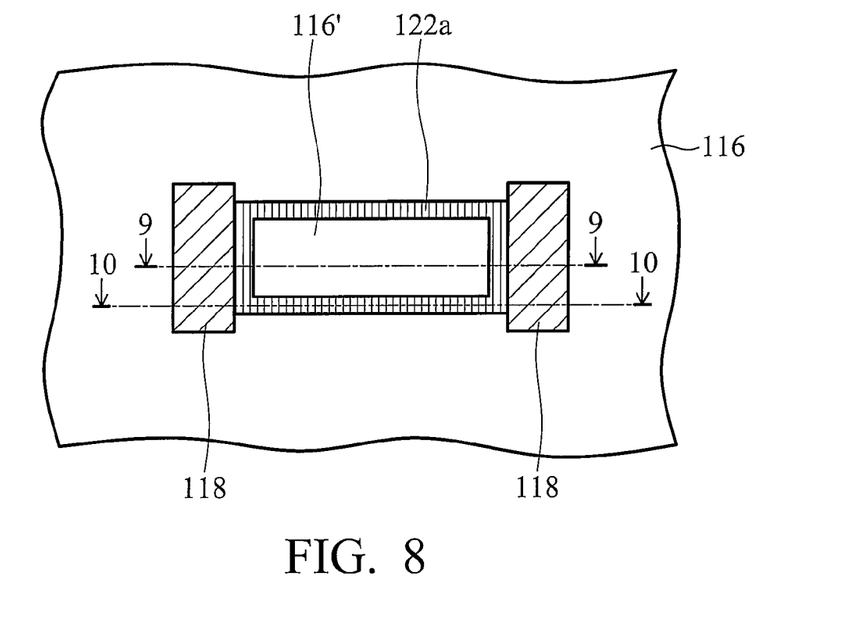
Figure 9:
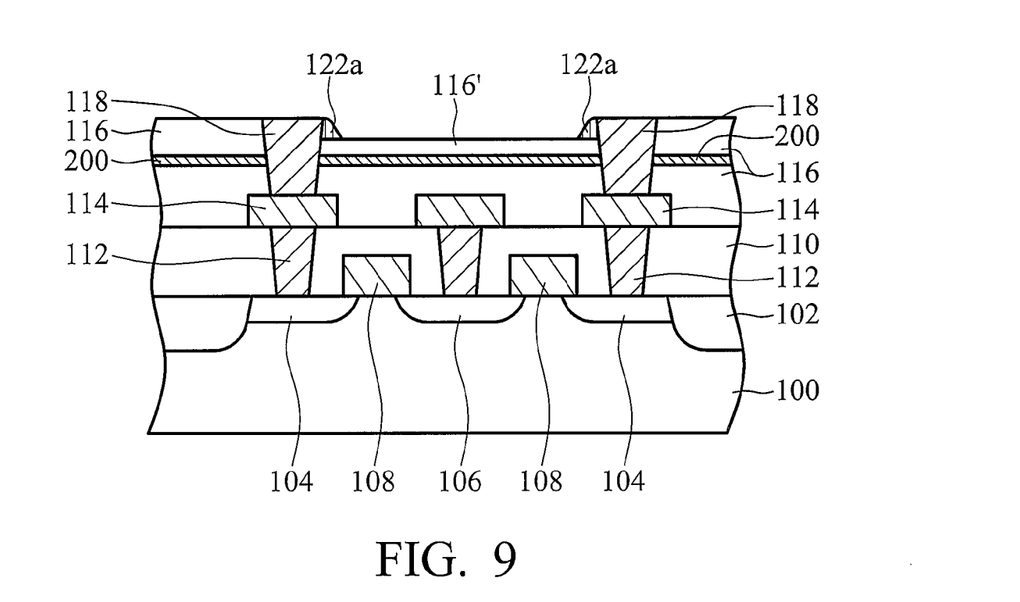
Figure 10:
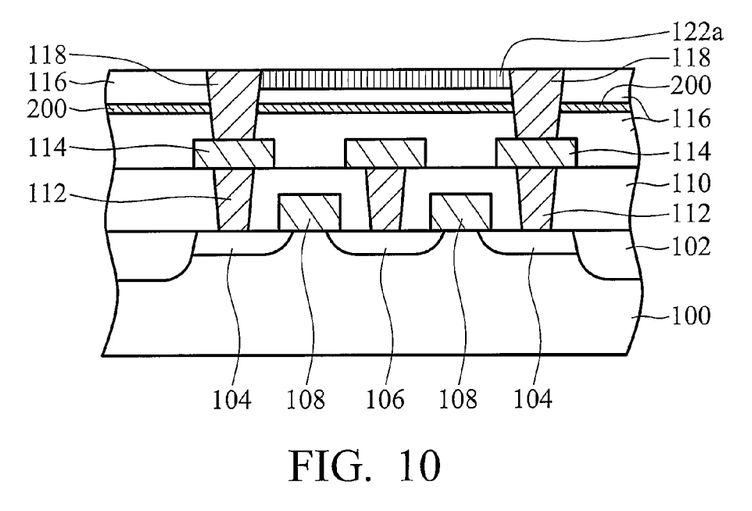

Referring now to FIGS. 8, 9 and 10, an etching process (not shown) is next performed on the structures illustrated in FIGS. 6 and 7 thereby leaving portions of the conductive layer 122a within the opening OP1. The etching process can be, for example, a dry etching process or other spacer forming etching process. Thus, the conductive layer 122a substantially along edges of the opening OP1 and adjacent the conductive plugs 118 therein is formed. As shown in FIGS. 9 and 10, the conductive layer 122a merely contacts a sidewall of the conductive plug 118, having a substantially curved side and a spacer-shaped structure.

Figure 11:
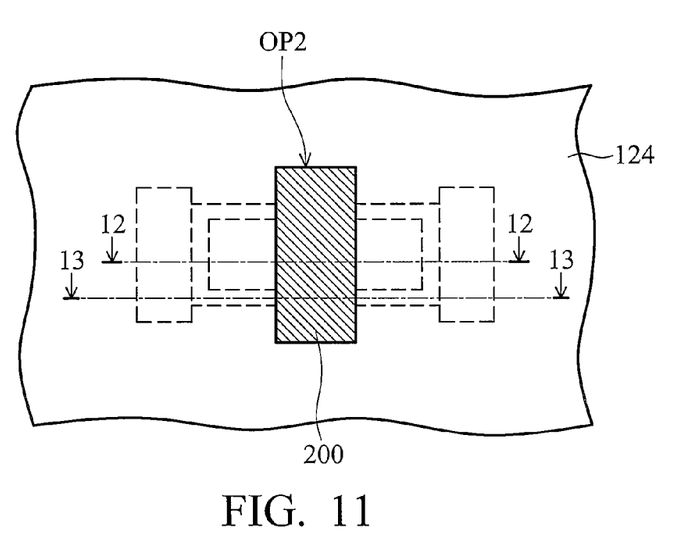
Figure 12:
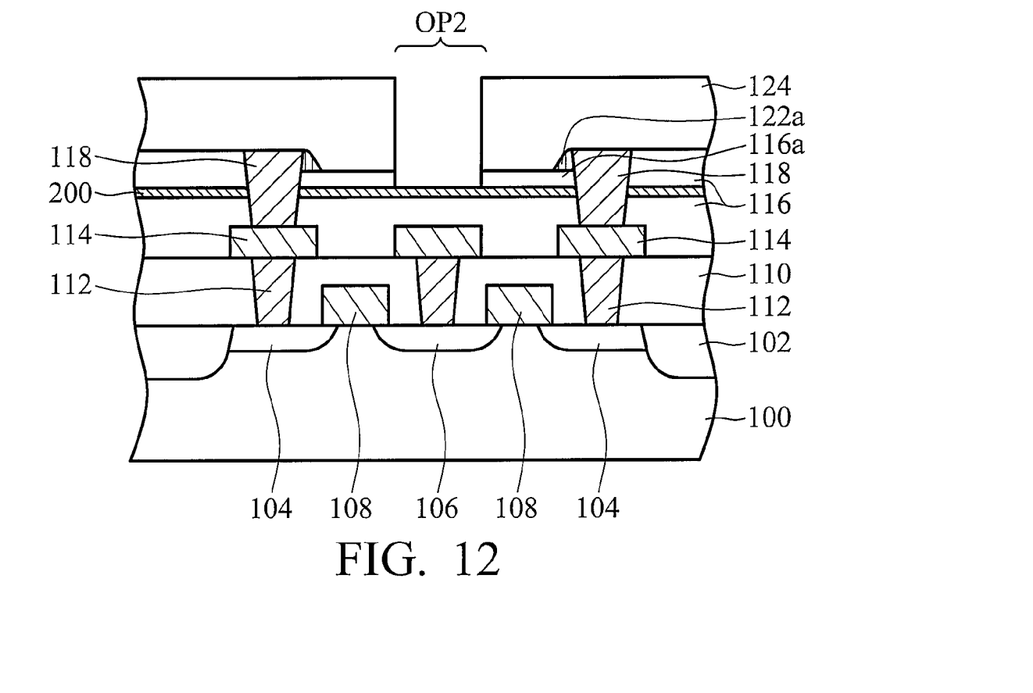
Figure 13:
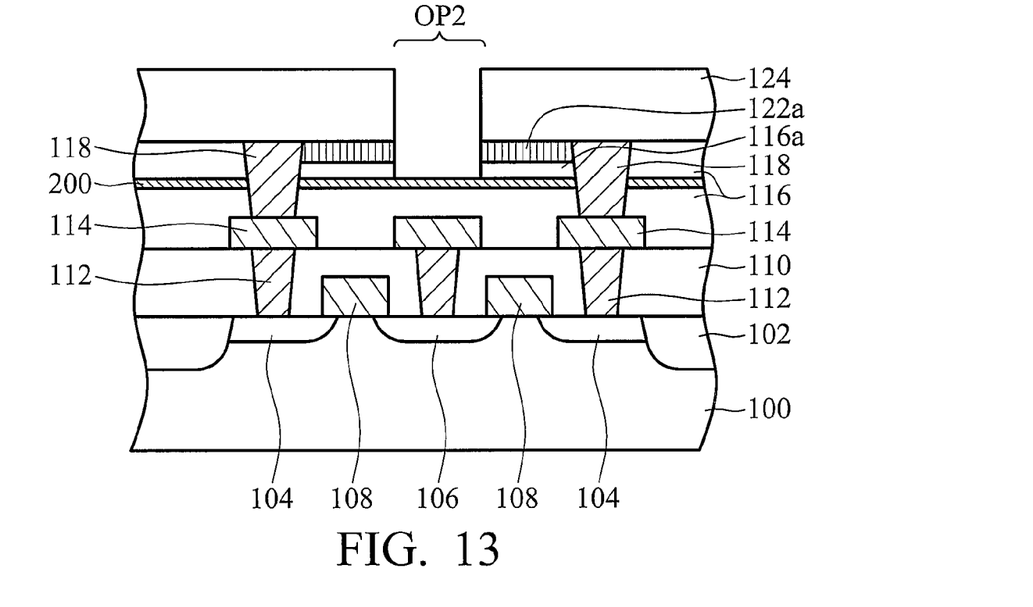

Referring now to FIGS. 11, 12 and 13, a planarization layer 124 is next formed over the structures illustrated in FIGS. 8, 9 and 10. The planarization layer 124 may comprise borophosphosilicate glass (BPSG), silicon oxide and spin on glass (SOG) and may be formed by methods such as CVD or spin-on process. An opening OP2 is then formed in planarization layer 124 by conventional photolithography and etching methods. The opening OP2 is formed through the planarization layer 124 and the thinned IMD layer 116a thereby exposing portions of the etching stop layer 200 and cutting off portions of the conductive layer 122a, as shown in FIG. 13. As shown in FIG. 11, the conductive layers 122a (illustrated as the dotted line) are not substantially disposed oppositely and separately in two separate areas, each having a substantially U-shaped top view and respectively contacting a conductive contact 118 adjacent thereto.

Figure 14:
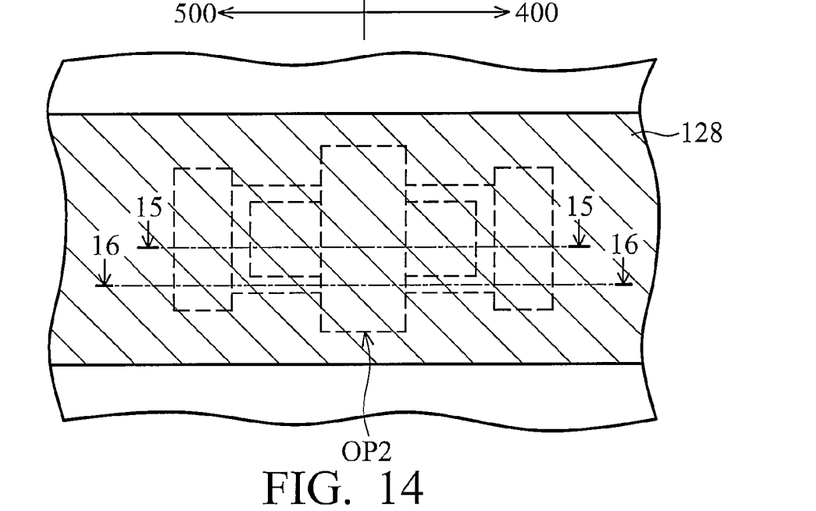
Figure 15:
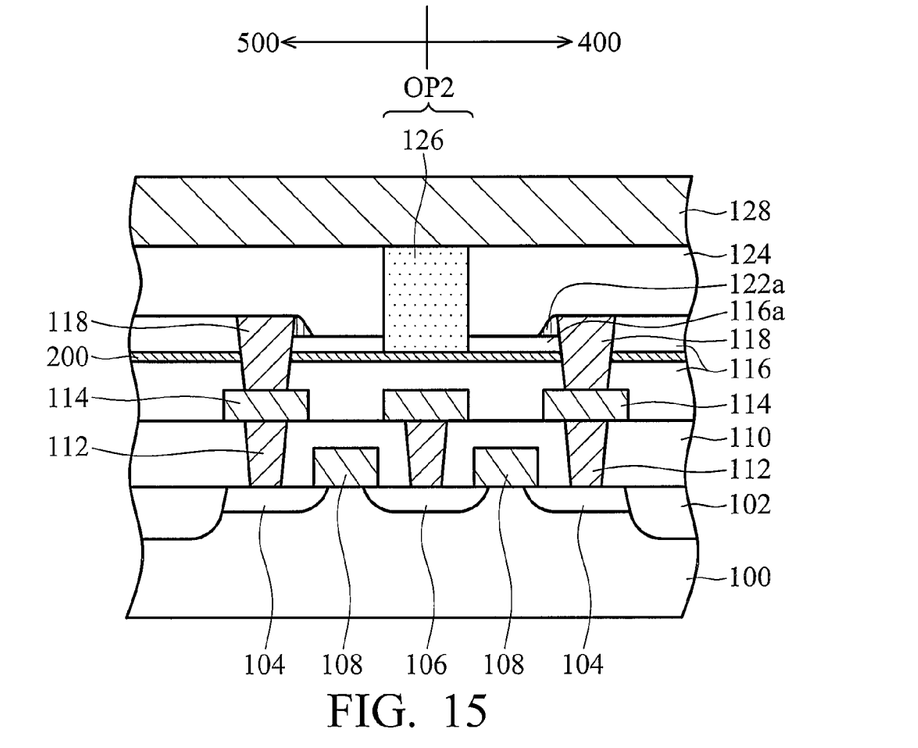
Figure 16:
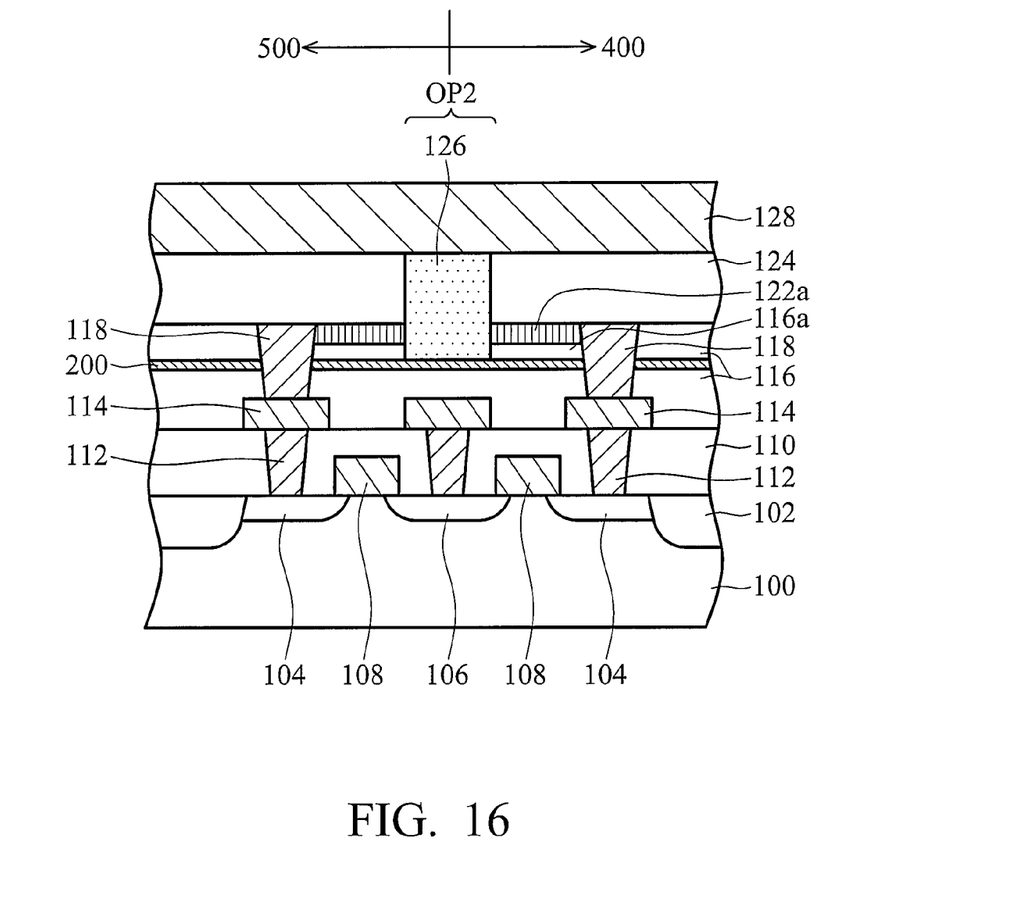

Referring now to FIGS. 14, 15 and 16, a phase change material layer 126 and a patterned conductive layer 128 are sequentially formed over the structures illustrated in FIGS. 11, 12 and 13, wherein the phase change material layer 126 fills the opening OP2 and the conductive layer 128 extends over the phase change material layer 126 to function as a top electrode. As shown in FIG. 16, the phase change material layer 126 formed in the opening OP2 electrically contacts the conductive contact 118 by the conductive layer 122a and thereby electrically connects the underlying transistor by the conductive contact 118. The phase change material layer 126 may comprise chalcogenide materials such as Ge—Te—Sb trinary chalcogenide compound or Te—Sb binary chalcogenide compound and can be formed by methods such as CVD or sputtering. The conductive layer 128 may comprise TiN, TiAlN, TaN or TiW. Herein, the phase change memory device is illustrated as a two-bit memory device, wherein a first bit unit is formed in the area 400 and a second bit unit is formed in the area 500. Note that the above bit units share a common phase change material layer 126 and the underlying transistors share a common drain 106, but are not limited thereto. The above bit units can be disposed individually and share a common phase change layer and/or drain 106 as will be understood by those skilled in the art.

Figure 17:
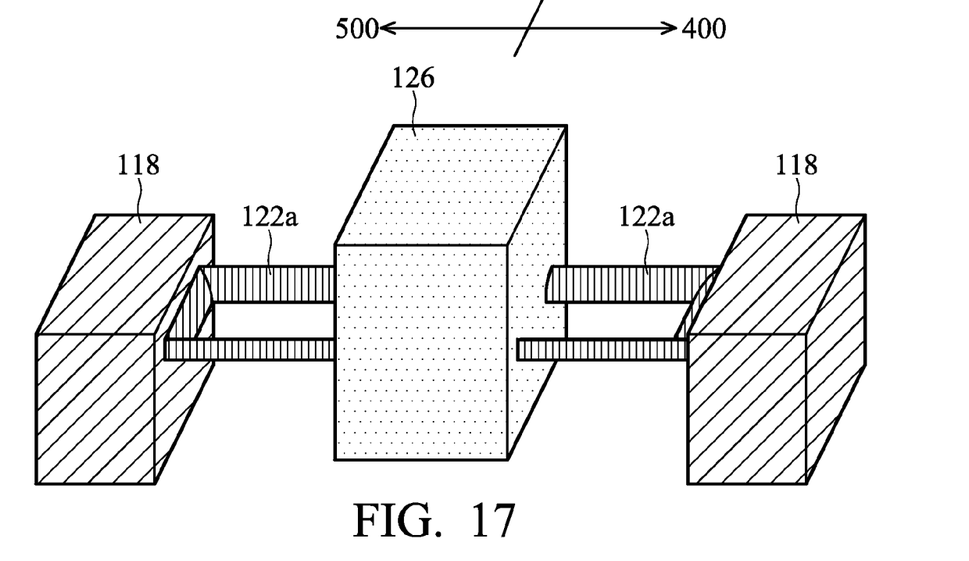
FIG. 17 shows a perspective stereo-drawing of a phase change memory device according to an embodiment of the invention.

Referring now to FIG. 17, a perspective stereo-drawing of a phase change memory device illustrated in FIGS. 14, 15 and 16 is illustrated. Herein, only the conductive plugs 118, the conductive layers 122a and the phase change material layer 126 in the areas 400 and 500 are illustrated for showing relative relations therebetween. Each of the conductive layers 122a functions as a heating electrode electrically connecting one of the conductive plugs 118 to thereby electrically connect a transistor thereunder. Each of the conductive layers 122a respectively contacts the phase change material layer 126 and a portion of the sidewall surface of one of the conductive plugs 118. Since the conductive layer 122a is formed by etching process, a contact region between the phase change material layer 126 and thereto can be further reduced through controlling the thickness of the conductive layers 122a and the depth of the opening OP1 and are not restricted by the photolithography process as described in the conventional method, thereby increasing the current density provided to the phase change material layer 126.

Figure 18:
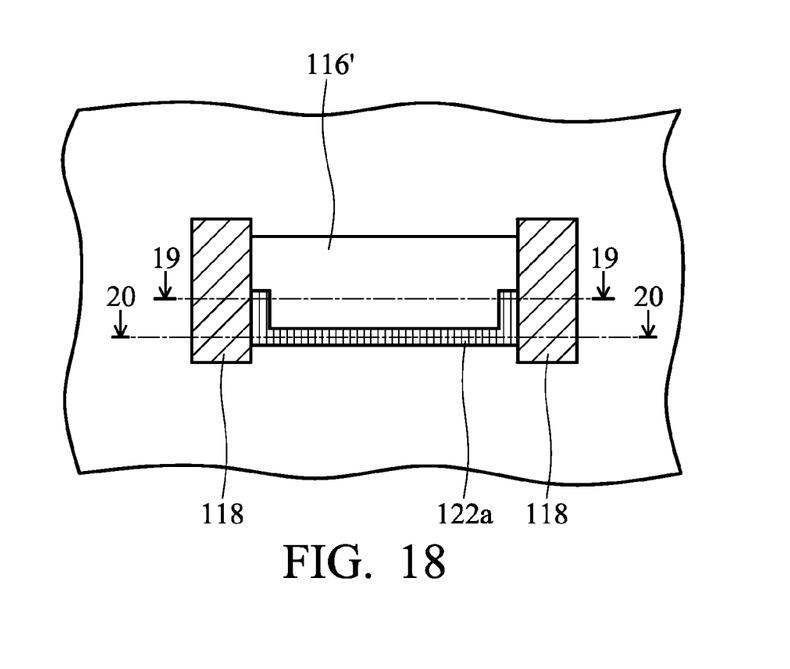
Figure 19:
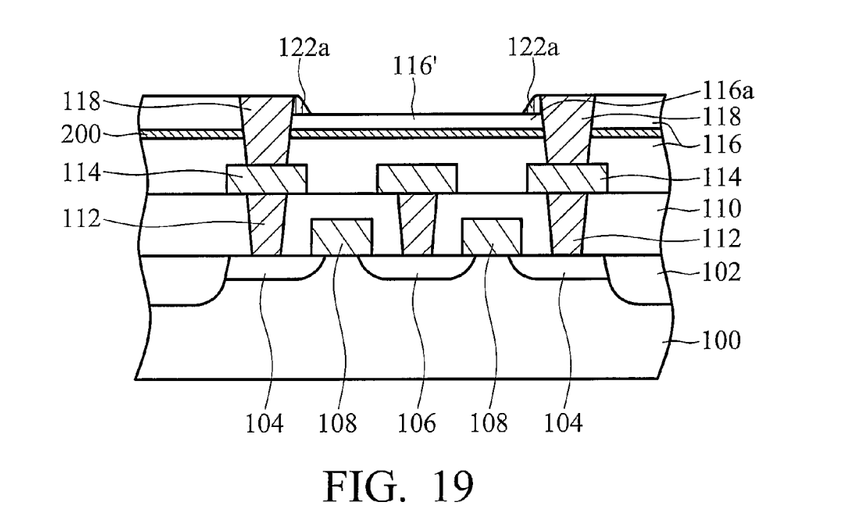
Figure 20:
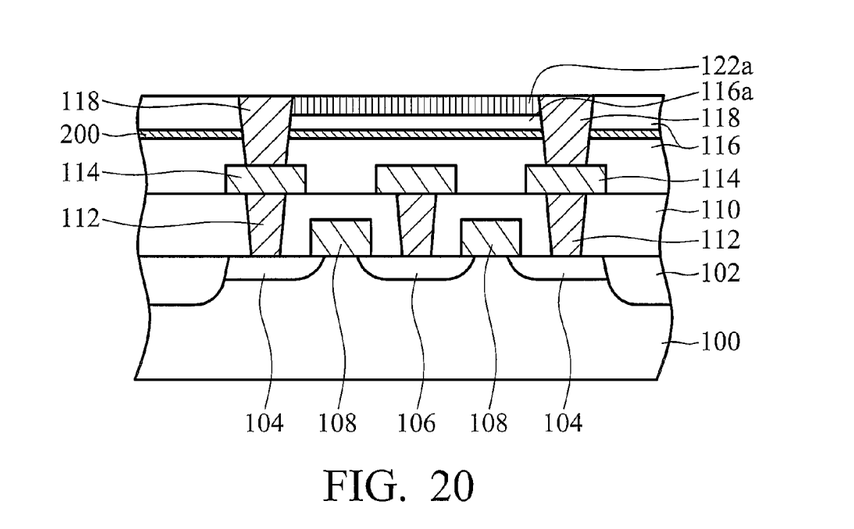
Figure 21:
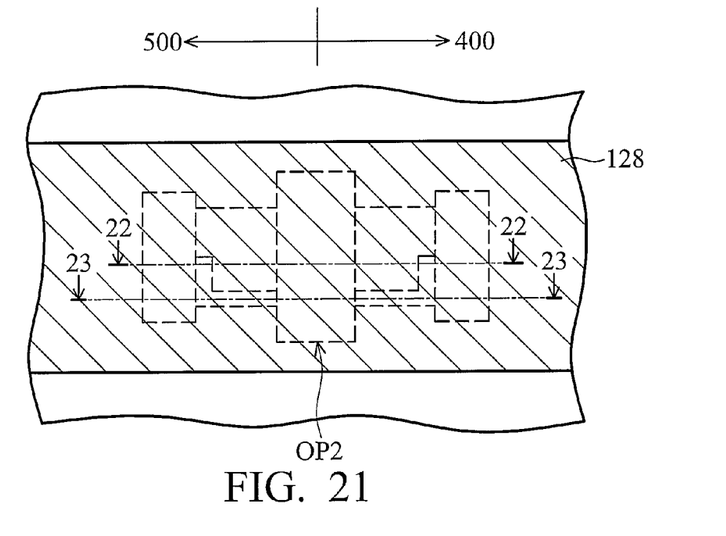
Figure 22:
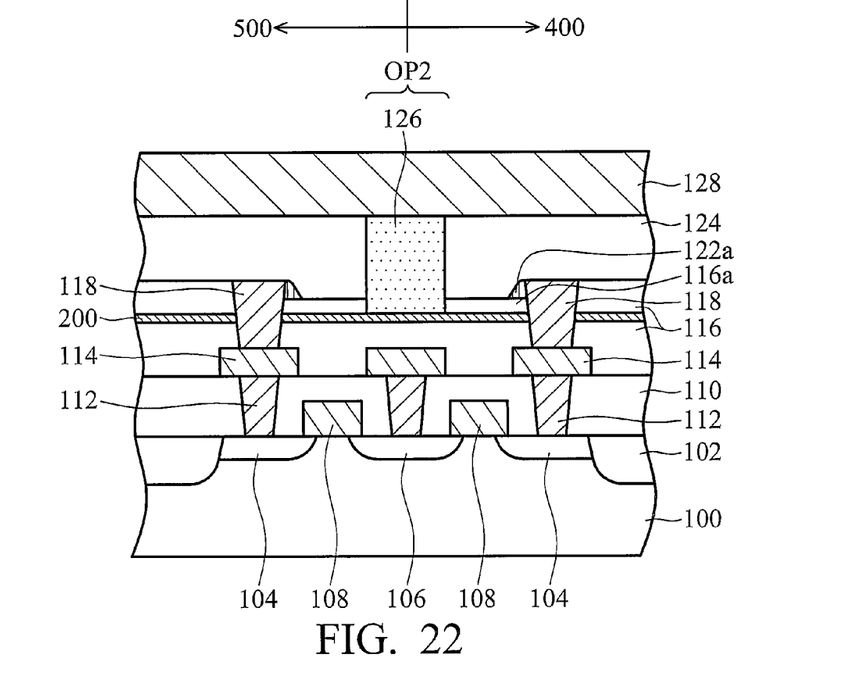
Figure 23:
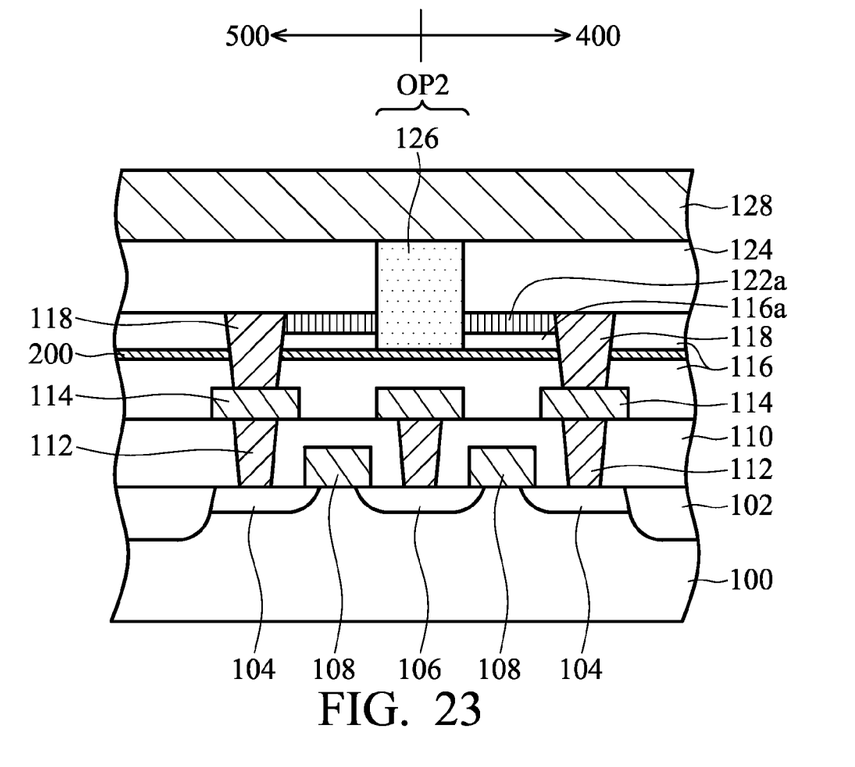
Figure 24:
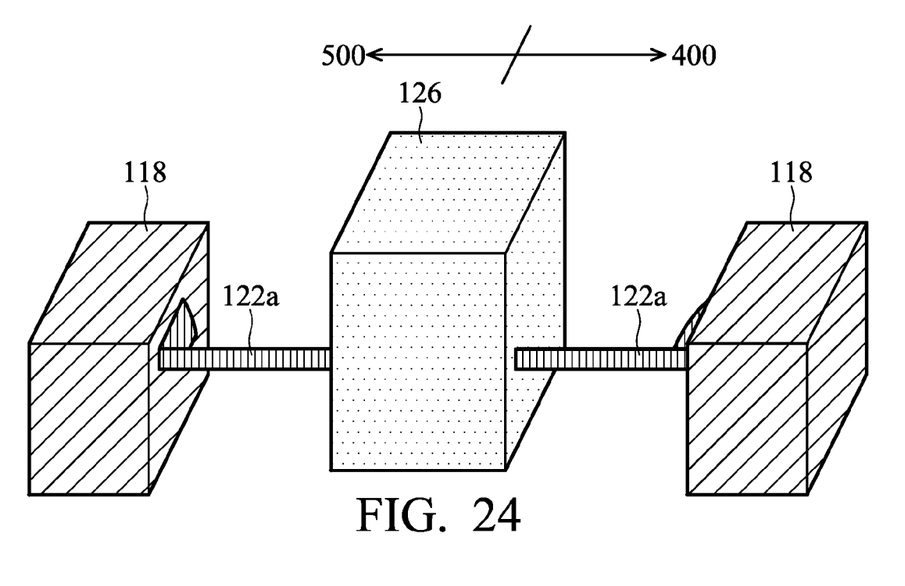
FIG. 24 shows a perspective stereo-drawing of a phase change memory device according to another embodiment of the invention.

FIGS. 18-24 illustrate different fabrication step of another exemplary method for fabricating a phase change memory device, wherein most the fabrication steps are similar to those illustrated through FIGS. 2-17 and only differences therebetween are illustrated and described here. FIGS. 18 and 21 are schematic top views of different fabrication steps for fabricating the phase change memory device and FIGS. 19-20 and 22-23 are cross sections of different fabrication steps for fabricating the phase change memory device. FIG. 24 illustrates a perspective stereo-drawing of the phase change memory device. In above figures similar title represent the same element illustrated in the previous embodiment and are not described here again, for simplicity.

Referring now to FIGS. 18, 19 and 20, the fabrication steps illustrated in FIGS. 2-10 are performed to thereby provide the structures illustrated in FIGS. 8, 9 and 10. Next, a patterned mask layer (not shown) is formed over the structures illustrated in the FIGS. 8-10 to partially cover the conductive layer 122a. Next, an etching process (not shown) is performed to remove portions of the conductive layer 122a exposed by the patterned mask layer and forms the structures illustrated in FIGS. 18-20 after removal thereof. Herein, the conductive layer 122a merely surrounds three edges of the opening OP1 and respectively contact the conductive plugs 118 adjacent thereto. The conductive also has a curve side and is formed as a spacer-shaped structure, as shown in FIG. 19.

Next, the fabrication steps illustrated in FIGS. 11-13 is performed again on the structures illustrated in the FIGS. 18-20 to thereby form the structures illustrated in FIGS. 21, 22 and 23, thereby leaving the L-shaped patterned phase conductive layer 122a illustrated in FIG. 21. Herein, the phase change memory device is illustrated as a two-bit memory device, wherein a first bit unit is formed in the area 400 and a second bit unit is formed in the area 500. Note that the above bit units share a common phase change material layer 126 and the underlying transistors share a common drain 106, but is not limited thereto. The above bit units can be disposed individually and share a common phase change layer and/or drain 106 and is understand by those skilled in the art. In addition, FIG. 24 illustrates a perspective stereo-drawing of a phase change memory device illustrated in FIGS. 21-23.

Referring now to FIG. 24, only the conductive plugs 118, the conductive layers 122a and the phase change material layer 126 in the areas 400 and 500 are illustrated for showing relative relations therebetween. Each of the conductive layers 122a functions as a heating electrode electrically connecting one of the conductive plugs 118 to thereby electrically connect to a transistor thereunder. Each of the conductive layers 122a respectively contacts the phase change material layer 126 and a portion of the sidewall surface of one of the conductive plugs 118. Since the conductive layer 122a is formed by etching process, a contact region between it and the phase change material layer 126 can be further reduced through controlling the thickness of the conductive layers 122a and the depth of the opening OP1 and are not restricted by the photolithography process as described in the conventional method, thereby increasing the current density provided to the phase change material layer 126.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory (PCM) device, comprising:
   a semiconductor substrate;
   a dielectric layer formed over the substrate;
   a conductive element formed in the dielectric layer;
   a phase change material layer formed in the dielectric layer; and
   a conductive layer extending in the dielectric layer, wherein the conductive layer has an L-shaped top view and opposite first and second sidewalls, the first sidewall physically contacting a sidewall rather than a top or bottom wall of the phase change material layer, and the second sidewall physically contacting a sidewall rather than a top or bottom wall of the conductive element, wherein the sidewalls of the conductive layer, conductive element, and phase change material layer are perpendicular to an upper surface of the substrate.

2. The PCM device as claimed in claim 1, wherein the conductive layer merely connects a portion of the phase change material layer.

3. The PCM device as claimed in claim 1, wherein the phase change material layer comprises chalcogenide materials.

4. The PCM device as claimed in claim 1, wherein the conductive layer has a spacer cross-section of a curved sidewall surface.

5. The PCM device as claimed in claim 1, wherein the conductive layer extends horizontally in the dielectric layer.

6. A phase change memory (PCM) device, comprising:
a semiconductor substrate;
a transistor formed over the semiconductor substrate;
a first dielectric layer formed over the semiconductor substrate, covering the transistor;
a first conductive plug formed in the first dielectric layer, electrically contacting a source of the transistor;
a second dielectric layer formed over the first dielectric layer;
a second conductive plug formed in the second dielectric layer, electrically contacting the first conductive plug;
a conductive layer extending in the second dielectric layer, wherein the conductive layer has an L-shaped top view opposite and first and second sidewalls, the first sidewall physically contacting a sidewall rather than a top or bottom wall of the second conductive plug;
a third dielectric layer formed over the second dielectric layer;
a phase change material layer formed in the third and second dielectric layers, wherein the second sidewall of the conductive layer physically contacts a sidewall rather than a top or bottom wall of the phase change material layer; and
an electrode formed over the third dielectric layer, electrically connected to the phase change material layer, wherein the sidewalls of the conductive layer, the second conductive plug, and the phase change material layer are perpendicular to an upper surface of the substrate.

7. The PCM device as claimed in claim 6, wherein the conductive layer merely connects a portion of the phase change material layer.

8. The PCM device as claimed in claim 6, wherein the phase change material layer comprises chalcogenide materials.

9. The PCM device as claimed in claim 6, wherein the conductive layer has a spacer cross-section of a curved sidewall surface.

10. The PCM device as claimed in claim 6, wherein the conductive layer extends horizontally in the second dielectric layer.

11. A phase change memory (PCM) device, comprising:
a semiconductor substrate;
a pair of transistors formed over a portion of the semiconductor substrate, respectively;
a first dielectric layer formed over the semiconductor substrate, covering the transistors;
a pair of first conductive plugs formed in a portion of the first dielectric layer, respectively, electrically contacting a source of one of the transistors;
a second dielectric layer formed over the first dielectric layer;
a pair of second conductive plugs formed in a portion of the second dielectric layer, respectively, electrically contacting the first conductive plug;
a pair of conductive layers extending in a portion of the second dielectric layer, respectively, wherein the conductive layers have an L-shaped top view and opposite first and second sidewalls, the first sidewalls respectively physically contacting a sidewall rather than a top or bottom wall of the second conductive plug;
a third dielectric layer formed over the second dielectric layer;
a phase change material layer formed in the third and second dielectric layers, wherein the second sidewalls of the conductive layers physically respectively contact a sidewall rather than a top or bottom wall of the phase change material layer; and
an electrode formed over the third dielectric layer, electrically connected to the phase change material layer, wherein the sidewalls of the conductive layers, second conductive plugs, and phase change material layer are perpendicular to an upper surface of the substrate.

12. The PCM device as claimed in claim 11, wherein the conductive layers merely connect a portion of the phase change material layer, respectively.

13. The PCM device as claimed in claim 11, wherein the phase change material layer comprises chalcogenide materials.

14. The PCM device as claimed in claim 11, wherein the conductive layers have a spacer cross-section of a curved sidewall surface.

15. The PCM device as claimed in claim 11, wherein the conductive layers extend horizontally in the second dielectric layer.

* * * * *